219-121.                SR 11-23-71        OR        3,622,742

United States Patent

[11] 3,622,742

[72] Inventors Melvin Irwin Cohen
Berkeley Heights;
Walter Werner Weick, Somerville; John Wesley West, Millington, all of N.J.

[21] Appl. No. 40,914
[22] Filed May 27, 1970
[45] Patented Nov. 23, 1971
[73] Assignee Bell Telephone Laboratories, Incorporated
Murray Hill, N.J.

[54] LASER MACHINING METHOD AND APPARATUS
6 Claims, 5 Drawing Figs.

[52] U.S. Cl. 219/121 L
[51] Int. Cl. B23k 9/00
[50] Field of Search 219/121 L, 121 LB

[56] References Cited

UNITED STATES PATENTS

| | | | |
|---|---|---|---|
| 3,398,234 | 8/1968 | Paidosh | 219/121 |
| 3,463,594 | 8/1969 | Myer | 219/121 L X |
| 3,534,462 | 10/1970 | Cruickshank et al. | 219/121 L X |

*Primary Examiner*—J. V. Truhe
*Assistant Examiner*—Lawrence A. Rouse
*Attorneys*—R. J. Guenther and Arthur J. Torsiglieri

ABSTRACT: Thin film integrated circuits are formed by coating insulative substrates with conductive film and mounting them on the periphery of a rotating drum. As the drum rotates, a switched laser machines the circuit pattern by vaporizing parts of the metal film of successive substrates. Light from another laser is directed through a mask on the drum circumference and controls modulation of the machining laser.

INVENTORS M. I. COHEN
W. W. WEICK
J. W. WEST
BY Robert B. Anderson
ATTORNEY

LASER MACHINING METHOD AND APPARATUS

BACKGROUND OF THE INVENTION

This invention relates to methods and apparatus for forming electronic circuit patterns or insulative substrates.

Certain modern electronic circuits, especially those used for new memory subsystems, are defined by a pattern of conductive film on an insulative substrate. By taking advantage of recently developed materials technologies, circuits of this type can significantly reduce the size and expense, and increase reliability reliability of finished electronic circuit packages.

The thin metal film is normally deposited on the insulative substrate by evaporation, with the metal film circuit pattern subsequently being defined by etching. Alternatively, evaporation through an appropriate mask may be used for circuit pattern formation. High-power lasers have been proposed as an aid in forming such circuits because of their ability to vaporize the metal film. By selective precision vaporization, a laser can be used to adjust the resistances of thin film resistors, or it can be used to cut the narrow slots required for forming small capacitors.

SUMMARY OF THE INVENTION

It is an object of this invention to provide a method and apparatus for forming thin metal electronic circuit patterns on ceramic substrates.

In accordance with the invention, substrates on which the circuit patterns are to be formed are coated with a conductive film which is selectively vaporized by the focused beam of a laser to form the desired circuit pattern. The circuit patterns to be machined are described by digital information; that is, by a train of stored electric pulses or "bits" each representing successive spots at which there is to be a presence or absence of metal film. For example, a positive pulse may represent a spot or region of the pattern in which there is to be no conductive film, while the absence of a pulse may represent a spot which is part of a conductor.

The substrates to be machined are mounted on the periphery of a rotating drum and successively exposed to the laser beam as the drum rotates. As a substrate moves through the laser beam path, the beam is modulated, or switched on and off, by the stored digital information representative of the circuit pattern. Thus, as the successive substrates are exposed to the laser beam, the metal coatings are selectively vaporized or left intact. The metal film portions that are not vaporized constitute the desired circuit pattern after the process has been completed.

In accordance with another feature of the invention, a second laser beam is directed through successive masks or code plates affixed to the periphery of the rotating drum. Each code plate is precisely positioned with respect to an associated substrate and contains a series of slots or transparent stripes. As the code plate rotates, a photodetector located behind it detects interrupted light projected through the slots as a series of pulses. These pulses are transmitted as a code signal to a control circuit, where each pulse of the code signal releases a corresponding information bit for modulating the machining beam. Since the machining beam modulation is precisely synchronized with the rotating drum, it vaporizes metal film to within close tolerances regardless of the velocity, or velocity deviations, of the rotating drum.

Since the substrates to be machined are normally flat, flat faces are preferably formed on the drum surface for more convenient mounting. The substrates can be precisely located with respect to the associated code plate by providing index pins to bear against two sides of the rectangular substrate and leaf springs to bear against the other sides. With each substrate snugly spring biased against the index pins, the circuit will be formed on a predetermined location of the substrate.

As the flat coated surface of the substrate rotates past the laser beam, the distance between the laser and the coated surface changes slightly. With a fixed optical system, this would defocus the laser spot unless the depth of field were sufficiently great. In accordance with another feature of the invention, the machining beam is focused by an axially movable lens that oscillates back and forth once during the passage of each substrate to maintain the laser spot substantially in focus on the substrate surface at all times. While precise compensation would require that the lens oscillate as a complicated trigonometric function of time, we have found that sinusoidal oscillation is sufficiently close to ideal conditions to be practical. The lens may therefore be driven by a sine wave generator that is triggered by an appropriate code from the coding signal.

These and other objects, features, and advantages will be better understood from a consideration of the following description taken in conjunction with the accompanying drawing.

DRAWING DESCRIPTION

DETAILED DESCRIPTION

Figure 1:
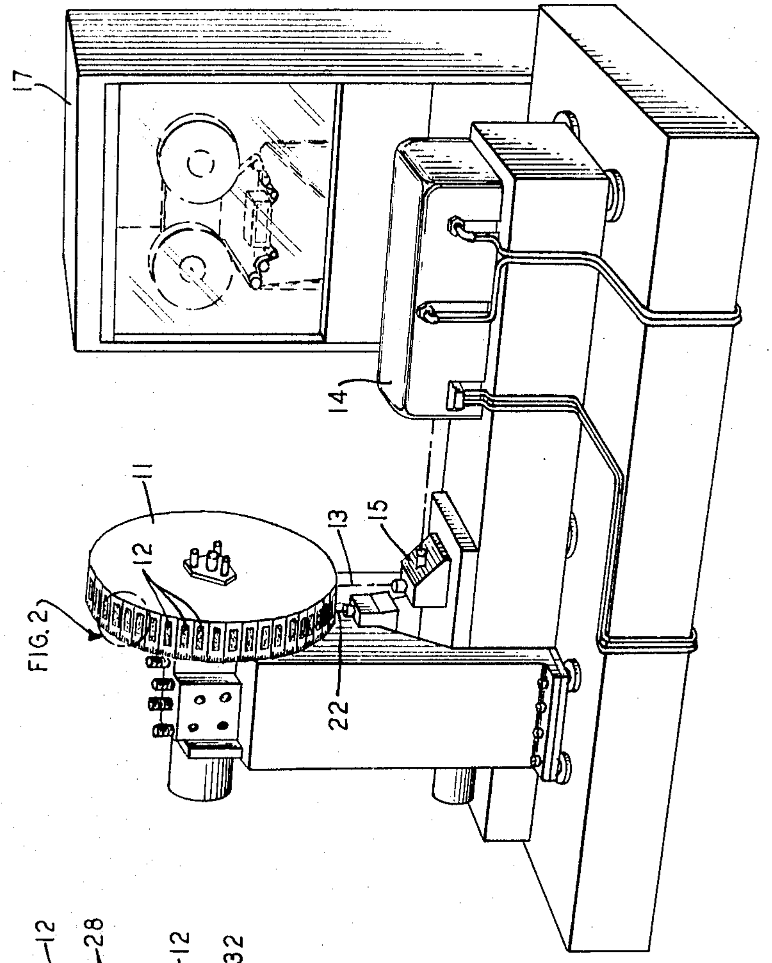
FIG. 1 is a perspective view of laser machining apparatus in accordance with an illustrative embodiment of the invention.

Referring now to FIG. 1, there is shown laser machining apparatus in accordance with an illustrative embodiment of the invention comprising a rotatable drum 11 upon which are mounted a plurality of substrates 12. A machining beam 13 generated by a laser 14 selectively vaporizes the metal film on successive substrates as the drum 11 rotates to form desired electronic circuit patterns on the substrates. The laser beam 13 is directed toward the successive substrates by a movable reflector 15. After each full rotation of the drum 11, the reflector moves slightly in a direction parallel to the drum axis so that a successive portion of each coated substrate is exposed to the focused laser spot.

As the drum rotates, the machining laser beam is digitally modulated, or periodically switched on and off, by a train of digital signals stored in a computer 17. The digital information represents the electronic circuit pattern to be machined on the substrates; for example, a positive voltage pulse or a "1" bit may represent a spot or region of the pattern at which the conductive film is to be vaporized, while the absence of a pulse represents a spot at which the conductive film is to remain intact. Normally, all of the circuits to be machined are identical, and if this is the case, the modulation of beam 13 is identical for each successive substrate that intercepts the beam during one drum rotation.

It is, of course, important that the machining beam modulation is appropriately synchronized with drum rotation, and for this purpose, a coding laser 18 is provided. As shown schematically on FIG. 2, code plates 19, each containing an array of slots 20, are affixed to the periphery of the drum, each code plate being associated with one substrate 12. As shown more clearly in FIG. 3, a coding beam 22 generated by the laser 18 is directed through the slots 20 of code plates 19 to a photodetector 23. The photodetector generates a pulse train in response to the interrupted code beam 22 which constitutes a code signal for synchronizing modulation of the machining beam with the rotation of the drum.

Figure 3:
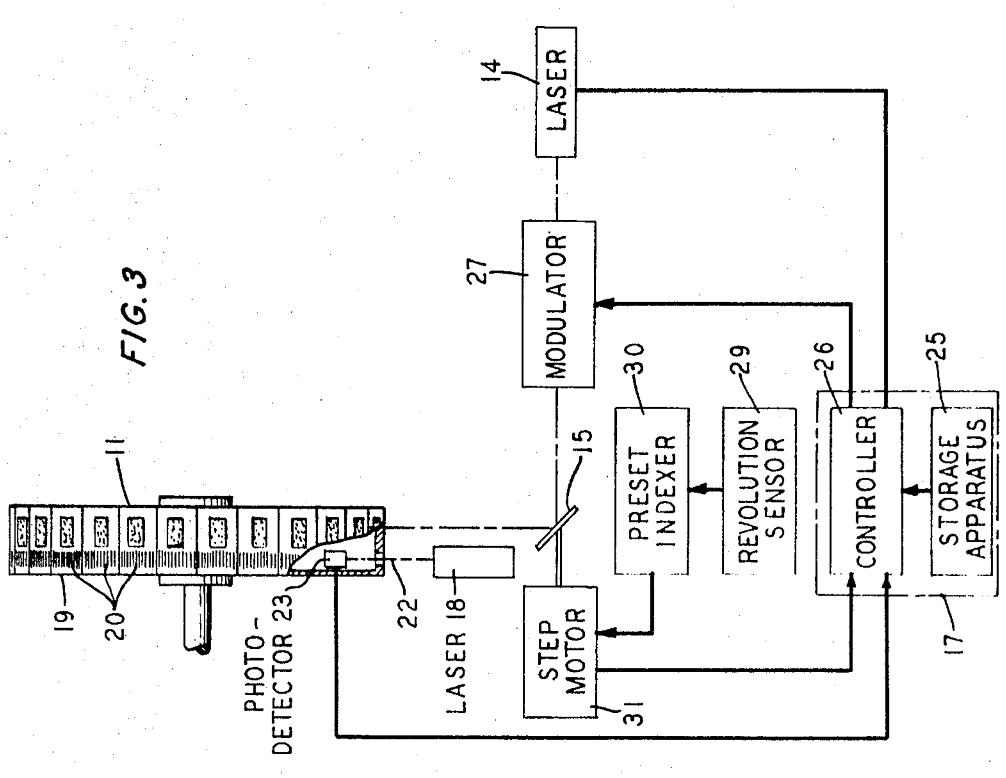
FIG. 3 is a schematic representation of the apparatus of FIG. 1.

As indicated schematically in FIG. 3, the computer 17 comprises storage apparatus 25 for storing the pulse code representative of the circuit to be formed, and a controller 26. Preferably, each code pulse generated by photodetector 23 corresponds to one pulse or bit position of the digital code stored in storage apparatus 25. Accordingly, controller 26 is preferably designed to release one modulated bit to modulator 27 in response to each pulse received from photodetector 23; of course, controller 26 could alternatively be designed to release a different integral number of pulses in response to each pulse received from the photodetector.

It is necessary that reflector 15 be moved with precision a controlled distance after each revolution of drum 11. This function is most straightforwardly accomplished by apparatus shown schematically as a revolution sensor 29, a preset indexer 30, and a step motor 31. The revolution sensor 29 senses in any known manner the completion of the drum revolution and transmits a signal to indexer 30 which in turn transmits a signal to motor 31 for moving the reflector 15 by the desired amount. The reflector is driven by a precision lead screw operated by the step motor. The step motor 31 may be designed in a known manner to transmit a signal to controller 26 to indicate the relocation of the laser spot.

Referring again to FIG. 2, the rectangular substrates 12 are preferably mounted by index pins 28 and leaf springs 32. The leaf springs apply orthogonal forces to two substrate sides and thereby cause the substrate to bear snugly against index pins 28. The permanently mounted index pins assure a proper location of the substrates with respect to the code plates 19, and thereby assure that the machined circuit patterns will be appropriately centered on each substrate.

Figure 2:
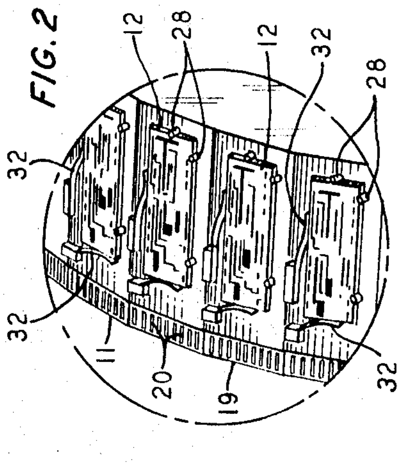
FIG. 2 is an enlarged view of certain mounted substrates of the embodiment of FIG. 1.

The apparatus shown in FIGS. 1 through 3 is particularly well suited for forming gold film circuits on alumina substrates. A typical circuit may be 1 inch by 3 inches with a minimum conductor width and separation of 1.5 mil. The laser spot size may then be 1.5 mil with the laser spot being stepped 0.5 mil after each drum rotation to give continuance machining where desired. The center-to-center spot separation also may be 0.5 mil for continuous machining. With a machining speed of 20 inches per second, the modulation rate is 40 kilohertz, and coding slots 20 may be on 2 mil centers with 500 slots per inch. Approximately 100 substrates may be fitted around the periphery of a drum having a 3 foot diameter.

A Q-switched YAG (for (for yttrim-aluminum-garnet) laser generating typically 1,000 watts peak power per Q-switched pulse has been found to be satisfactory. The power required is dependent upon the thickness of gold to be removed. The controller 26 of FIG. 3 is shown as transmitting an output to laser 14 because it is preferred that stored pulses from the controller control the Q-switching of the laser as well as the modulation period. The laser could alternatively be a continuously operating laser having an output gated by the modulator 27; but in practice a pulsed laser is normally required for metal vaporization. The modulator 27 is preferably an acoustic deflection cell.

Controller 26 may typically include a shift register containing a train of information pulses which is gated by each pulse of the coding signal to release an information bit to the modulator 27. Appropriate counters and a "buffer store" device may be used for controlling transmission of information from the storage apparatus 25 to the shift register. As mentioned before, these components may be part of a general purpose computer which may be programmed, as would be clear to a worker in the art, to accomplish the function described. A commercially available Digital Equipment Corporation PDP—15 computer would be suitable for this purpose.

Figure 4:
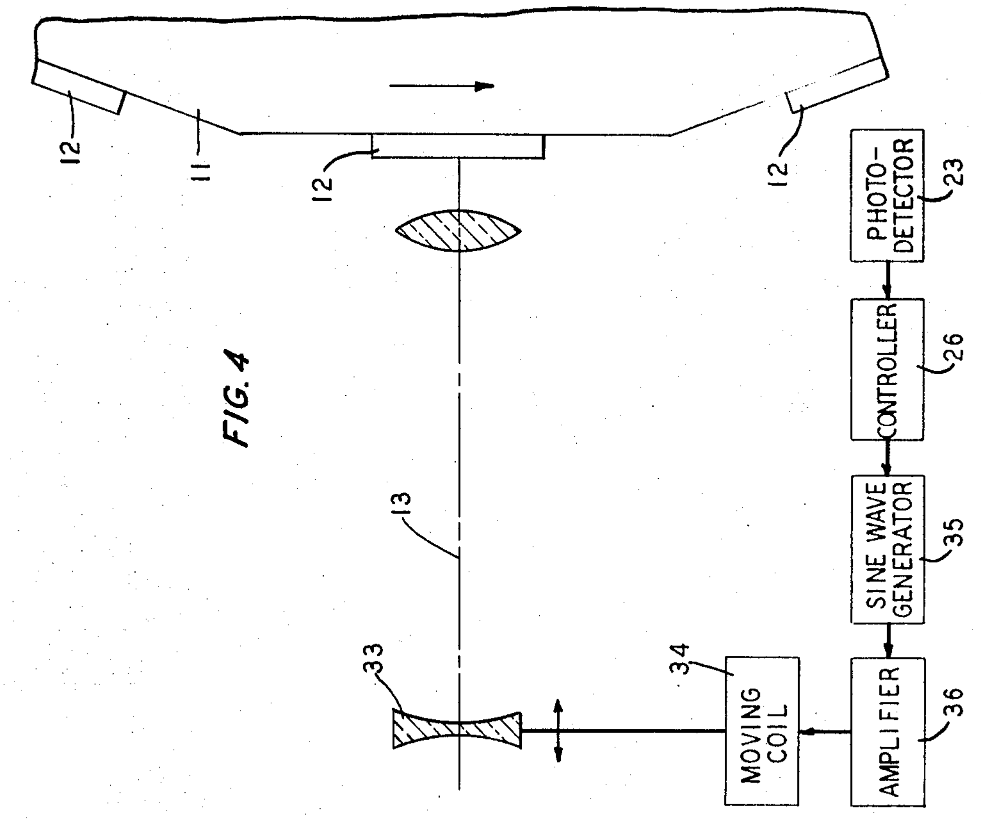
FIG. 4 is a schematic view of focal compensation apparatus that may be used in the apparatus of FIG. 1.

Referring to FIG. 4, it is evident that the point at which laser beam 13 impinges on a substrate 12 moves back and forth as the drum 11 rotates. It follows that if the laser beam 13 is focused on the substrate 12 with the substrate in one position, the beam will be somewhat defocused with the substrate in a successive position. It can be shown that the axial distance D that the intercept point moves, and thus the amount by which the laser beam is defocused, is given by, $D = W^2\ 8\ R^2$ where $W$ is the width of each substrate 12 and $R$ is the radius of drum 11. Whether this deviation distance is tolerable depends largely on the focus required and the depth of field of the optical system used to focus the laser beam. Where $W$ is 1 inch, and the radius $R$ is nine inches, the defocus distance $D$ is 0.014 inch.

In the FIG. 3 embodiment, a lens 33 is mechanically caused to oscillate back and forth by a moving coil 34 to compensate for the axially moving intercept point of beam 13 with substrate 12. The actual oscillatory movement of the intercept point with respect to time is a rather complex trigonometric function, and, to provide precise compensation, the lens 33 would have to be driven by a similar wave function. In practice, however, we have found that, if the lens moves sinusoidally for one-half cycle during the machining of each substrate, compensation will be sufficient in virtually all cases. For example, with the substrate width $W$ and drum radius $R$ given above, a sinusoid drive will reduce the defocus $D$ to about 0.001 inch. Accordingly, the coil 34 is preferably driven by a sine wave generator 35 through an amplifier 36, although alternatively, generator 35 could be a function generator that generates a wave function providing more accurate compensation than the sine wave.

Because the oscillation of lens 33 must be synchronized with the rotation of drum 11, it is convenient that the sine wave generator 35 be controlled by the output of photodetector 23. The controller 26 therefore transmits a synchronizing pulse to the sine wave generator 35 determined by the photodetector output, which phase locks generator 35, so that each sinusoid cycle commences at the proper instant. The programming of controller 26 to generate such a signal in response to a characteristic input from the photodetector is a matter within the ordinary skill of a worker in the art.

Figure 5:
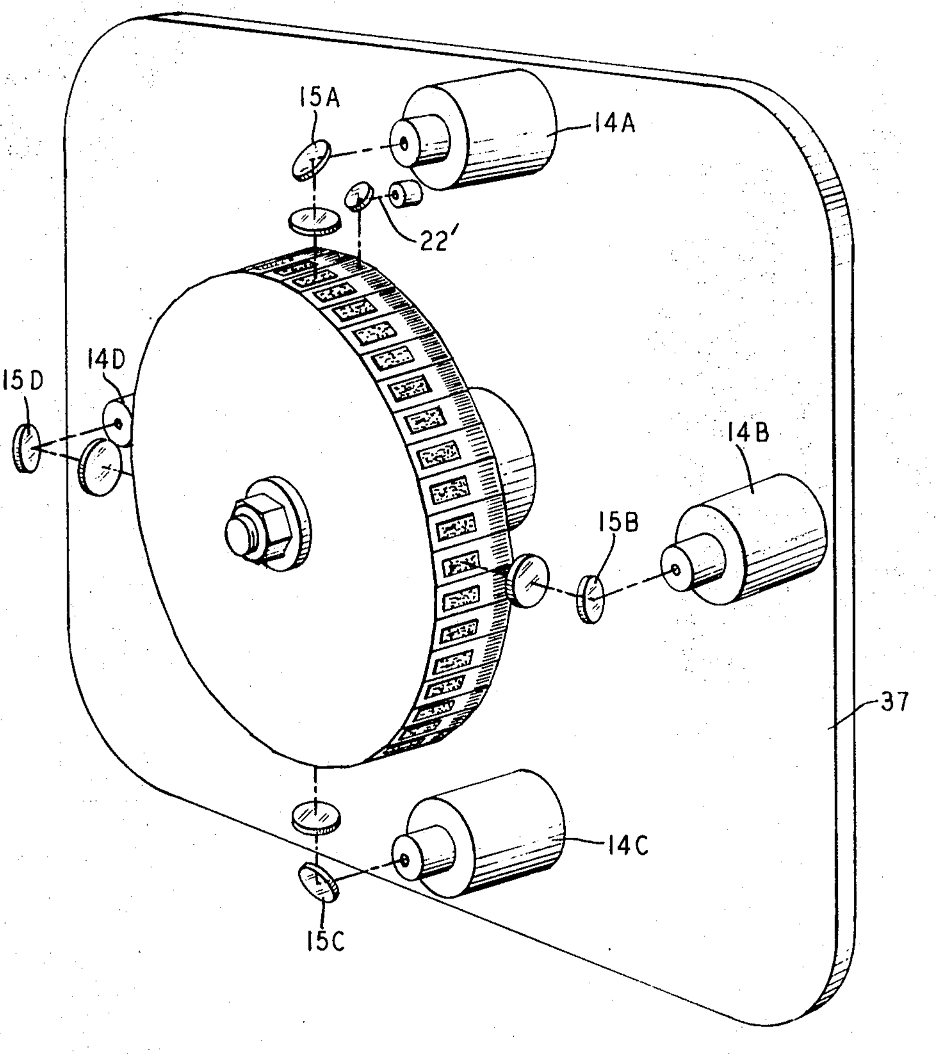
FIG. 5 is a schematic view of an alternative embodiment illustrating employment of a plurality of machining lasers in apparatus of the general-type shown in FIG. 1.

FIG. 5 illustrates how four lasers 14A –14D may be mounted in quadrature around the rotating drum periphery to reduce machining time. The machining lasers and associated reflectors 15A –D are mounted on a rigid support 37. Reflectors 15A –D are driven by a stepped motor as before, but, during the course of operation, each one directs its laser beam to scan only one quarter of the periphery of the drum. The machining laser beams simultaneously operate on different portions of the substrate array, and machining time is accordingly reduced. All four lasers are preferably controlled by a common computer and only a single-laser code beam 22 need be provided for synchronization. However, since four lasers operate on each substrate, it is important that each substrate be precisely mounted and located on the drum periphery to avoid discontinuities. Proper programming of the computer to permit simultaneous operation by the four lasers is well within the realm of ordinary skill in the art.

In any of the embodiments, the substrates may be mounted on the surface of a disk, rather than the periphery of a cylinder, if so desired. While this would avoid the out-of-focus problem, it will result in vaporization of the metal films along curved paths. This in turn would necessitate coordinate transformation to produce the rectilinear patterns normally required. Appropriate computer programming to give the required beam modulation for such transformation is within the ordinary skill of the art.

In summary, a system has been disclosed for machining with high precision a circuit pattern from a thin metal film. The system uses a rotating drum which rotates at a constant velocity during the process, and a laser beam which need be stepped from one position to another only once during each rotation of the laser drum. Precise synchronization is assured by a coding scheme making use of code plates on the drum periphery. Although it is clear from equation (1) that optical systems for maintaining the laser beam in focus on the successive substrates are feasible if the drum radius is sufficiently large and the substrate widths are sufficiently small, apparatus has been shown for moving the focal point in synchronism with the drum location. A plurality of lasers may be used to increase machining rates.

The various embodiments shown and described are intended merely to be illustrative of the inventive concept. Various other embodiments and modifications may be made by those skilled in the art without departing from the spirit and scope of the invention.

We claim:

1. A method for making electronic circuits comprising the steps of:

covering a surface of each of a plurality of substrates with a conductive film;

mounting the substrates on the surface of a rotatable member;

forming and storing a series of electrical pulses, the sequential presence or absence of a pulse in the series being indicative of the presence or absence of a conductor with respect to distance in the circuit to be made;

vaporizing part of the metal film on the substrate to form a pattern of the circuit comprising the steps of directing a high-power laser beam toward the surface, substantially continuously rotating the rotatable member to expose sequentially the coated substrates to the laser beam, modulating the laser beam with said series of electrical pulses, and periodically moving the location of beam impingement with respect to the rotatable member;

inserting a lens in the path of the high-power laser beam to focus it onto the substrate, and axially moving the lens back and forth to change the position of laser beam focus to compensate for movement of the substrate.

2. The method of claim 1 wherein:

the axial lens movement is controlled by a sine wave generator; and further comprising the steps of:

synchronizing lens movement with rotation of the rotatable member comprising the step of phase locking the sine wave generator with the electrical pulse code.

3. Laser-machining apparatus comprising:

means for mounting a plurality of elements to be machined on a continuously rotating member;

a coding member located on the rotating member;

means for forming a machining light beam and directing it to successive machinable elements on the rotating member;

means for forming a coding beam and directing it to the coding member;

means comprising information storage apparatus for modulating the intensity of the machining beam;

means responsive to the coding beam for actuating the information storage apparatus to cause successive stored signal increments to modulate the machining beam;

means comprising a lens for focusing the machining beam onto the successive elements;

and means responsive to the coding beam for causing said lens to oscillate axially in synchronism with the movement of successive machinable elements, thereby to maintain the focus of the machining beam on the successive elements.

4. The laser-machining apparatus of claim 3 wherein:

the rotating member rotates at a substantially constant velocity;

and the lens oscillates through a distance that varies substantially as a sinusoidal function of time.

5. The laser-machining apparatus of claim 4 further comprising:

means comprising a photodetector for generating electrical pulses in response to said periodically interrupted coding beam; and wherein:

the means for driving the lens comprises a sine wave generator; and the means for causing lens oscillation in synchronism comprises means for phase locking the sine wave generator to the output of said photodetector.

6. Laser-machining apparatus comprising:

a rotating member having a plurality of flat peripheral faces;

means for mounting a rectangular element to be machined on each of said faces, said mounting means each comprising at least three index pins and at least tow leaf springs, one of said index pins being adapted to bear on a first side of the rectangular element, two of said rectangular pins being adapted to bear against a second side of the element, one of said springs being adapted to bear on the third side of the element, and another of the springs being adapted to bear on the fourth side of the element, whereby each element may be removably mounted in a position determined by said index pins;

means for causing said rotating member to rotate substantially continuously;

a coding member located on the rotating member;

means for forming a machining light beam and directing it to successive rectangular elements on the rotating member;

means for forming a coding beam and directing it to the coding member;

means comprising information storage apparatus for modulating the intensity of the machining beam;

and means responsive to the coding means for actuating the information storage apparatus to cause successive stored signal increments to modulate the machining beam.

* * * * *